United States Patent
Hamren

(10) Patent No.: US 6,492,826 B2
(45) Date of Patent: Dec. 10, 2002

(54) CONDUCTIVE BUMP ARRAY CONTACTORS HAVING AN EJECTOR AND METHODS OF TESTING USING SAME

(75) Inventor: Steven L. Hamren, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/912,617

(22) Filed: Jul. 24, 2001

(65) Prior Publication Data

US 2001/0040463 A1 Nov. 15, 2001

Related U.S. Application Data

(62) Division of application No. 09/865,335, filed on May 24, 2001, now Pat. No. 6,388,459, which is a division of application No. 09/351,935, filed on Jul. 12, 1999, now Pat. No. 6,265,886.

(51) Int. Cl.[7] .......................... G01R 31/02; G01R 1/073
(52) U.S. Cl. ........................................ 324/755; 324/761
(58) Field of Search .................................. 324/754, 755, 324/758, 761, 765; 439/66, 68, 71, 700, 912

(56) References Cited

U.S. PATENT DOCUMENTS

| | | | | |
|---|---|---|---|---|
| 5,015,946 A | * | 5/1991 | Janko ........................ 324/754 |
| 5,419,710 A | * | 5/1995 | Pfaff ......................... 439/71 |
| 5,500,605 A | | 3/1996 | Chang ....................... 324/758 |
| 5,518,410 A | | 5/1996 | Masami ...................... 439/71 |
| 5,955,888 A | | 9/1999 | Frederickson et al. ...... 324/761 |
| 6,036,503 A | * | 3/2000 | Tsuchida .................... 439/66 |
| 6,066,957 A | | 5/2000 | Van Loan et al. .......... 324/758 |
| 6,292,003 B1 | * | 9/2001 | Fredrickson et al. ........ 324/755 |

* cited by examiner

*Primary Examiner*—Ernest Karlsen
(74) *Attorney, Agent, or Firm*—Dorsey & Whitney LLP

(57) ABSTRACT

The present invention is directed toward conductive bump array contactors having an ejector and methods for testing bumped devices using such apparatus. In one aspect of the invention, an apparatus includes a base having a plurality of contact elements projecting therefrom, an ejector coupled to the base and moveable with respect to the base between a first position proximate the base and a second position spaced apart from the base, and an actuating device coupled to the base and to the ejector that asserts a force on the ejector. The biasing force is sufficient to overcome a sticking or attractive force that may develop between the conductive bumps and the contact elements. In one embodiment, the contact elements project into a single opening defined by the ejector. Alternately, the ejector includes a plurality of apertures, each contact element at least partially projecting into one of the apertures. Each aperture may have a receiving end sized to at least partially receive one of the conductive bumps to provide improved alignment of the conductive bumps with the contact elements. In yet another aspect, a method of testing a bumped device includes providing a base having a plurality of contact elements projecting therefrom, positioning an ejector at least partially between the base and the bumped device, aligning the array of conductive bumps with the plurality of contact elements, applying an engaging force to the bumped device to move the ejector toward the base and to move the conductive bumps into contact with the contact elements, transmitting test signals to the bumped device through at least some of the contact elements, and releasing the engaging force from the bumped device to allow the ejector to disengage the conductive bumps from the contact elements.

18 Claims, 5 Drawing Sheets

CONDUCTIVE BUMP ARRAY CONTACTORS HAVING AN EJECTOR AND METHODS OF TESTING USING SAME

This application is a divisional of U.S. patent application Ser. No. 09/865,335, filed May 24, 2001, now U.S. Pat. No. 6,388,459, which is a divisional of U.S. patent application Ser. No. 09/351,935, filed Jul. 12, 1999, now U.S. Pat. No. 6,265,886.

TECHNICAL FIELD

The present invention relates to conductive bump array contactors having an ejector and methods for testing bumped devices using such apparatus, suitable for use with, for example, bumped die, chip scale packages, multi-chip modules, and the like.

BACKGROUND OF THE INVENTION

Bumped die and other bumped devices are widely used throughout the electronics industry. As the drive toward smaller electronics continues, the pitch (or spacing) of the conductive bumps on bumped devices continues to decrease. The increasingly finer pitches of the conductive bumps raise concerns about the reliability of these devices, placing greater emphasis on the accuracy and efficiency of bumped device testing.

FIG. 1 is an isometric view of a conventional conductive bump array contactor 10 that may be used to test a bumped device 20 (commonly referred to as a Device Under Test or DUT) having an array of conductive bumps 22. The bumped device 20 includes a substrate layer 24 and an encapsulating layer 26. The array contactor 10 includes a base 12 having a plurality of cylindrical apertures 14 disposed therethrough. A spring probe 16 is disposed within each aperture 14, each spring probe having a first end 15 and a second end 17. The first end 15 may be flush with, or extend slightly from, a top opening 18 of the aperture 14. Similarly, the second end 17 may be flush with, or extend slightly from, a bottom opening 19 of the aperture 14. Conductive bump array contactors 10 of the type shown in FIG. 1 are described in U.S. Pat. No. 5,570,033 to Staab.

During testing, the bumped device is positioned over the base 12 with the conductive bumps 22 aligned with the openings 18. The bumped device 20 engages the base 12 so that each of the conductive bumps 22 is in contact with the first end 15 of one of the spring probes 16. The bumped device 20 may be pressed against the base 12 so that the first ends 15 are at least partially compressed into the spring probes 16. The second ends 19 may then engage a plurality of contact pads of a test machine (not shown), which transmits test signals through one or more of the spring probes 16 to the bumped device 20. The test machine may also receive output signals from the bumped device 20 to determine whether the bumped device 20 is performing according to specifications. After testing, the bumped device 20 may be disengaged from the conductive bump array contactor 10, and another bumped device may be tested in the same manner.

Although desirable results have been achieved using the conductive bump array contactor 10, problems may be encountered during separation of the bumped device 20 from the array contactor 10. For example, while the conductive bumps 22 are in contact with the first ends 15 of the spring probes 16, material from the conductive bumps 22 may migrate and become attached to the first ends 15. This may cause the conductive bumps 22 to become stuck to the first ends 15 of the spring probes 16. When one or more of the conductive bumps 22 becomes stuck to the spring probes 16, the testing process may be delayed as additional time and effort is expended to disengage the bumped device 20 from the array contactor 10.

The sticking or bonding of the conductive bumps 22 to the spring probes 16 occurs with increasing frequency as the number of tests using the array contactor 10 increases. Also, as the number of conductive bumps 22 on the bumped device 20 increases, the probability that more of the conductive bumps 22 will become stuck increases, further decreasing the speed and efficiency of the testing process.

An additional concern with the array contactor 10 is that the bumped device 20 may not be accurately aligned with the top openings 18 of the apertures 14. If the conductive bumps 22 are not precisely aligned with the top openings 18, the first ends 15 of the spring probes 16 may not properly contact the conductive bumps 22, and the testing may provide inaccurate or unreliable results. As the pitch of the conductive bumps 22 decreases, the task of aligning the conductive bumps 22 with the spring probes 16 becomes more difficult.

SUMMARY OF THE INVENTION

The present invention relates to conductive bump array contactors having an ejector and methods for testing bumped devices using such apparatus. In one aspect of the invention, a conductive bump array contactor includes a base having a plurality of contact elements projecting therefrom an ejector coupled to the base and moveable with respect to the base between a first position proximate the base and a second position spaced apart from the base, and a biasing device coupled to the base and to the ejector that asserts a biasing force on the ejector. The biasing force is sufficient to overcome a sticking or attractive force that may develop between the conductive bumps and the contact elements, thereby positively disengaging the conductive bumps from the contact elements after tests are performed. In one embodiment, the contact elements project into a single opening at least partially defined by the ejector. Alternately, the ejector includes a raised alignment member that engages the bumped device to align the conductive bumps with the contact elements.

In another aspect of the invention, an apparatus includes an ejection plate having a plurality of apertures alignable with the array of conductive bumps. each aperture having a receiving end sized to at least partially receive one of the conductive bumps when the bumped device is engaged with the ejection plate. The receiving ends provide improved alignment of the conductive bumps with the contact elements. The contact elements may be spring probes, or may be buckle-beam probes, or any other suitable contact members.

In yet another aspect of the invention, a method of testing a bumped device includes providing a base having a plurality of contact elements projecting therefrom, positioning an ejector at least partially between the base and the bumped device, aligning the array of conductive bumps with the plurality of contact elements, applying an engaging force to the bumped device to move the ejector toward the base and to move the array of conductive bumps into contact with the plurality of contact elements, transmitting test signals to the bumped device through at least some of the contact elements, and releasing the engaging force from the bumped device to allow the ejector to move away from the base, the ejector disengaging the array of conductive bumps from the plurality of contact elements. In this way, positive disengagement of the conductive bumps from the contact elements is achieved.

DETAILED DESCRIPTION OF THE INVENTION

The following description is generally directed toward conductive bump array contactors having an ejector apparatus and methods for testing bumped devices using such apparatus. Many specific details of certain embodiments of the invention are set forth in the following description and in FIGS. 2–5 to provide a thorough understanding of such embodiments. One skilled in the art, however, will understand that the present invention may have additional embodiments, or that the present invention may be practiced without several of the details described in the following description.

Figure 1:
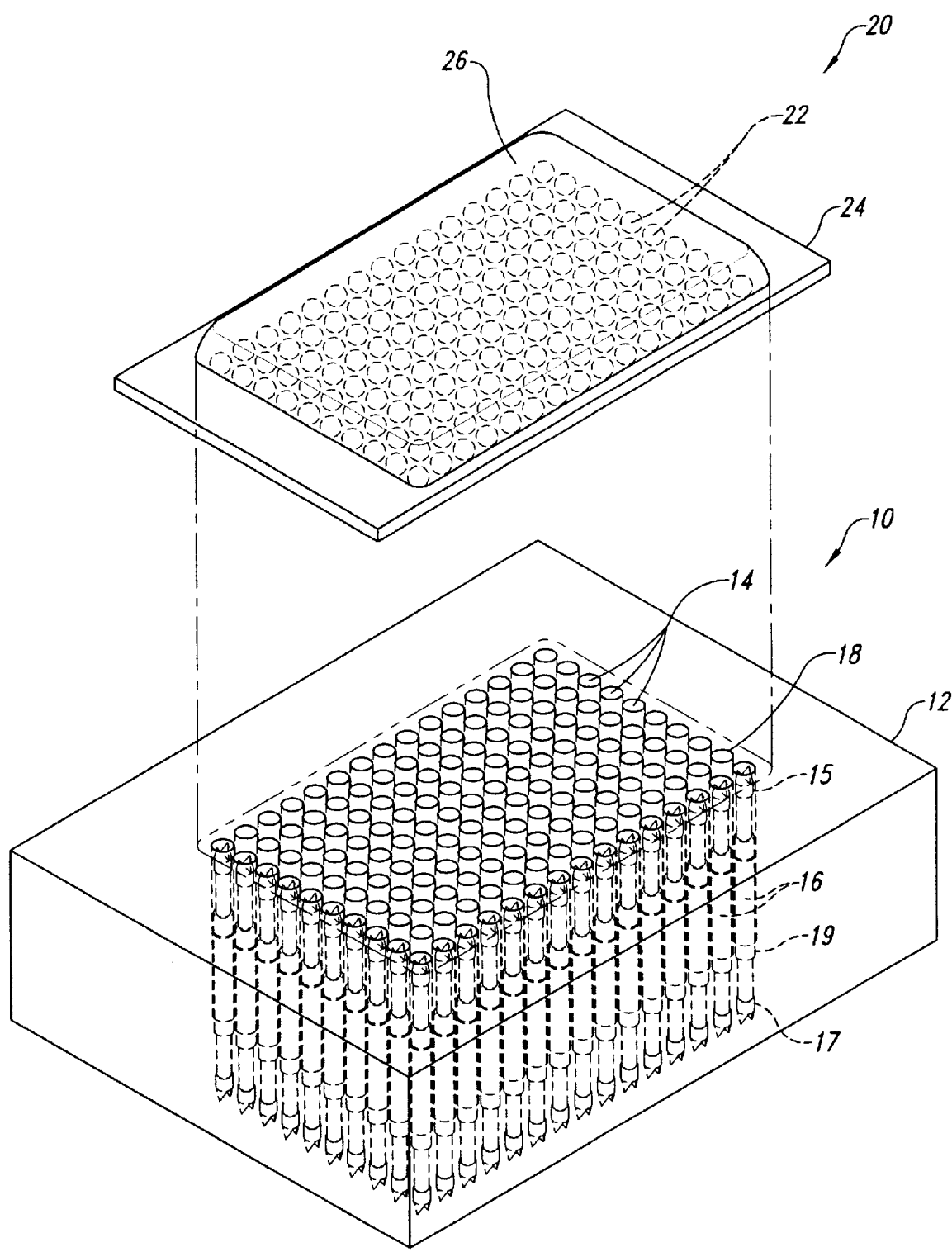
FIG. 1 is an isometric view of a conductive bump array contactor and a bumped device in accordance with the prior art.
Figure 2:
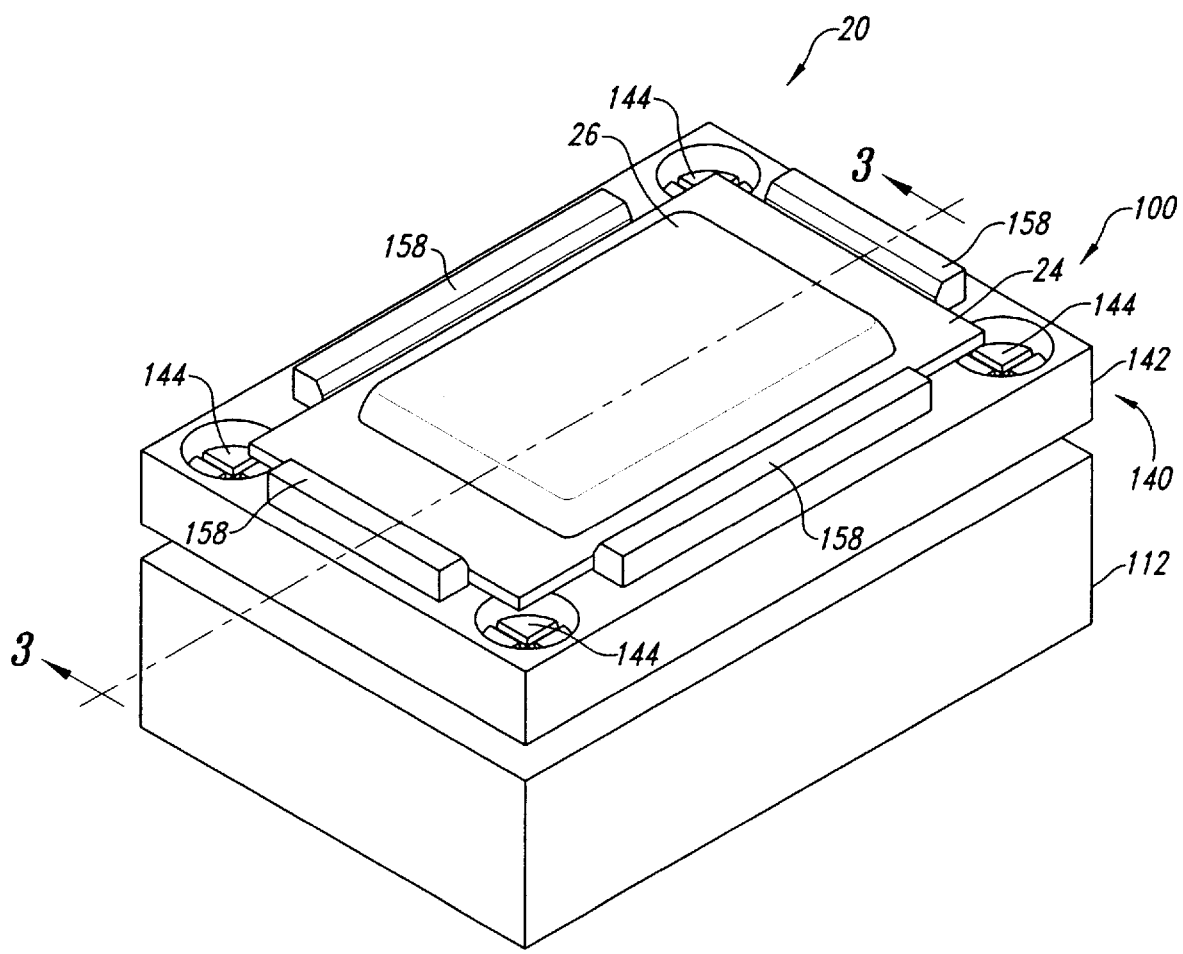
FIG. 2 is an isometric view a conductive bump array contactor in accordance with an embodiment of the invention engaged with the bumped device of FIG. 1.

FIG. 2 is an isometric view a conductive bump array contactor 100 in accordance with an embodiment of the invention engaging the bumped device 20 of Figure 1. In this embodiment, the array contactor 100 includes a base 112 and an ejector assembly 140. The ejector assembly 140 is coupled to the base 112 and engageable with the bumped device 20 to positively disengage the bumped device 20 from the base 112 after testing.

Figure 3:
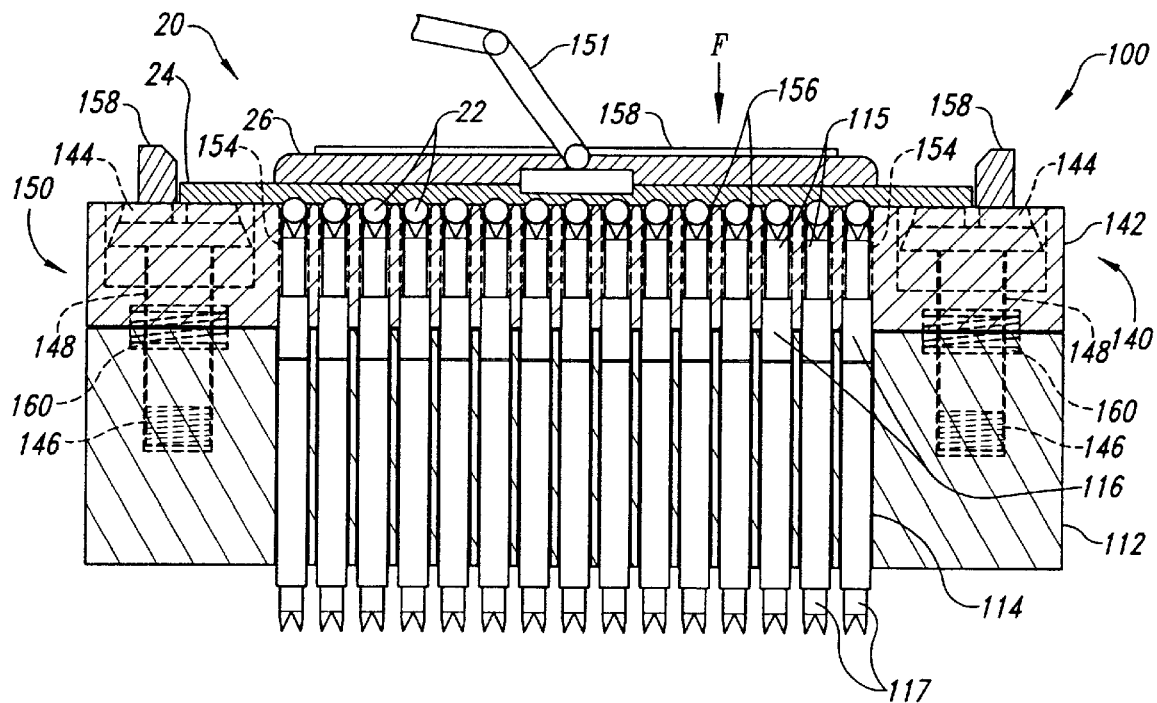
FIG. 3 is a cross-sectional view of the conductive bump array contactor and the bumped device of FIG. 2 taken along line III—III.
Figure 4:
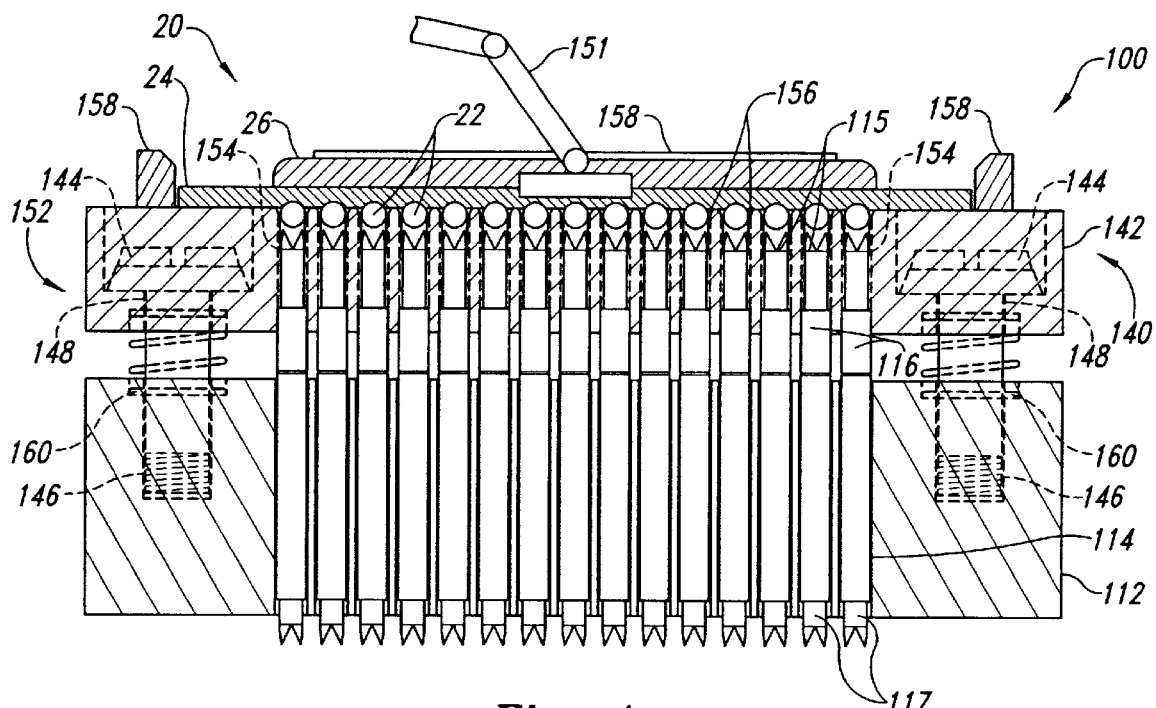
FIG. 4 is a cross-sectional view of the conductive bump array contactor and the bumped device of FIG. 3 with the ejector in a second position.

FIG. 3 is a cross-sectional view of the conductive bump array contactor 100 and the bumped die 20 of FIG. 2 taken along line 3—3. FIG. 4 is a similar cross-sectional view with the ejector assembly 140 in a second position 152. The base 112 has a plurality of cylindrical base apertures 114 disposed therethrough with a spring probe 116 positioned within each base aperture 114. Each spring probe 116 has a first end 115 and a second end 117 that project out of the base 112.

The ejector assembly 140 includes an ejection plate 142 slideably coupled to the base 112 by four guide bolts 144. The guide bolts 144 are threadedly engaged into threaded holes 146 in the base 112. Each guide bolt 144 has a cylindrical shaft that forms a guide post 148 upon which the ejector plate 142 slideably moves between a first position 150 proximate the base 112 (FIG. 3) and a second position 152 spaced apart from the base 112 (FIG. 4). A coil spring 160 is disposed about each of the guide posts 148 between the ejection plate 142 and the base 112 to bias the ejection plate 142 into the second position 152.

The ejection plate 142 includes a plurality of plate apertures 154 disposed therethrough and aligned with the spring probes 116. The plate apertures 154 are sized to receive the first ends 115 of the spring probes 116 such that the first ends 115 project into and through the plate apertures 154 but generally do not touch the ejection plate 142. Each plate aperture 154 includes a partially-conical receiving end 156 for receivably engaging the conductive bumps 22 of the bumped device 20. The ejection plate 142 also includes four raised alignment members 158 (see FIG. 2) that project upwardly from the ejection plate 142 to engage the substrate 24 of the bumped device 20.

The base 112 and the ejection plate 142 may be fabricated from any suitable electrically-insulative material. Alternately. the base and ejection plate may be fabricated of a slightly conductive material to inhibit or eliminate the development of electrostatic charges (EST) that might damage the bumped device 20. Suitable materials include, for example, Torlon® manufactured by Amoco Performance Products, Inc., of Alpharetta. Ga., or Ultem® available from General Electric, Inc. of Pittsfield, Mass.

To begin testing, the conductive bump array contactor 100 is at rest in the second position 152 with the ejection plate 142 spaced apart from the base 112 (FIG. 4). The bumped device 20 is positioned over the ejection plate 142 with the conductive bumps 22 facing the receiving ends 156 of the plate apertures 154. As the bumped device 20 is moved into engagement with the ejection plate 142, the alignment members 158 engage the substrate 24 of the bumped device 20 and begin aligning the conductive bumps 22 with the receiving ends 156 of the plate apertures 154. The conductive bumps 22 are further aligned with the first ends 115 of the spring probes 116 as the bumps are at least partially received into the receiving ends 156 of the plate apertures 154.

The bumped device 20 is then pressed against the ejection plate 142 with an applied force F that is sufficient to compress the coil springs 160, causing the ejection plate 142 to begin moving toward the first position 150 proximate the base 112 (FIG. 3). The applied force F may be applied, for example, by a handler 151. Numerous types of handlers are suitable for controllably positioning the bumped device 20 during engagement with and removal from the conductive bump array contactor 100, including, for example, those shown and described in U.S. Pat. No. 5,184,068 to Twigg et. al., or U.S. Pat. No. 5,828,223 to Rabkin et. aL, (both incorporated herein by reference) or the IC handlers available from Verilogic Corporation of Denver, Colo.

As the coil springs 160 are compressed by the applied force F, the conductive bumps 22 contact the first ends 115 of the spring probes 116. The first ends 115 may be compressed at least partially into the spring probes 116. or the spring probes 116 may slideably move within the base apertures 114 (causing the second ends 117 to protrude further from the bottom of the base apertures 114), or a combination of both compression and slideable movement may occur, depending upon the design features of the spring probes 116. During this engagement, the first ends 115 of the spring probes 116 are maintained in physical (and electrical) contact with the conductive bumps 22.

The applied force F continues to compress the coil springs 160 until the ejection plate 142 comes into contact with the base 112 in the first position 150 (FIG. 3). The second ends 117 of the spring probes 116 are coupled with a test machine (not shown) that transmits electrical signals through at least some of the spring probes 116 and conductive bumps 22 to perform the desired tests on the bumped device 20. Typically, the test machine also receives output signals through some of the spring probes 116 to evaluate the performance of the bumped device 20.

Although the spring probes 116 shown in FIGS. 3 and 4 are depicted as being spring-loaded at both the first and second ends 115, 117, a variety of different spring probes may be used, including those which are spring loaded at only the first end 115. Also, the first and second ends 115, 117 need not be pointed. A variety of commercially-available spring probes are suitable for use in the conductive bump array contactor 100, including the various models available from Interconnect Devices, Inc. of Kansas City, Kans. or those available from Rika Denshi America, Inc. of Attleboro, Mass. Alternately, the spring probes 116 may be replaced with other commonly known contact elements, including, for example, buckle-beam probes or contact fingers of the type described in U.S. Pat. No. 5,419,710 to Pfaff, or resilient terminals of the type described in U.S. Pat. No. 5,376,010 to Petersen (both patents incorporated herein by reference).

After the desired tests have been performed, the applied force F is removed. The coil springs 160 decompress, urging the ejection plate 142 toward the second position 152 spaced apart from the base 112 (FIG. 4). As the ejection plate 142 is urged into the second position 152, the conductive bumps 22 are pulled away from the first ends 115 of the spring probes 116. Thus, the coil springs 160 positively disengage the conductive bumps 22 from the first ends 115, overcoming any sticking, bonding, or attractive forces that may develop between the conductive bumps 22 and the spring probes 116. The bumped device 20 may then be easily removed from the ejection plate 142 by the handler 151, and the conductive bump array contactor 100 is ready to be used for testing another bumped device 20.

One may note that the coil springs 160 may be replaced by any suitable biasing or actuating device that is capable of urging or moving the ejection plate 142 into the second position 152 with sufficient force to overcome the sticking or attractive forces that may develop between the conductive bumps and the spring probes. Alternate devices may provide a force continuously or non-continuously, and may be controllable such that the force is provided only at desired times (e.g. immediately after testing). Suitable alternative devices include, for example, resilient plastic or foam members, leaf springs, electromagnets, and pneumatic or hydraulic pistons.

The conductive bump array contactor 100 with the ejector assembly 140 advantageously provides positive disengagement of the bumped device 20 from the spring probes 116 after testing is complete. Because the coil springs 160 force the ejection plate 142 away from the base 112 with sufficient force to overcome sticking or bonding forces due to intermetallic migration and the like, the conductive bumps 22 are quickly and efficiently disengaged from the spring probes 116 after testing. The time, effort, and expense associated with disengaging the bumped device 20 from the spring probes 116 is reduced or eliminated, and the speed and efficiency of the testing process is improved.

Another advantage of the ejector assembly 140 is that the conductive bumps 22 of the bumped device 20 are aligned with the spring probes 116 by engagement with both the alignment members 158 and the receiving ends 156 of the plate apertures 154. The alignment members 158 engage the edges of the substrate 24 to provide a first-order alignment of the conductive bumps 20 with the contact elements. More precise (second-order) alignment is provided as the conductive bumps 22 are at least partially engaged into the receiving ends 156. Thus, the ejection plate 142 also doubles as an alignment feature allowing the device to align to the contact elements (spring probes 116) by the conductive bumps 22, which is more accurate and consistent than aligning off the edge of the bumped device 20 alone.

Figure 5:
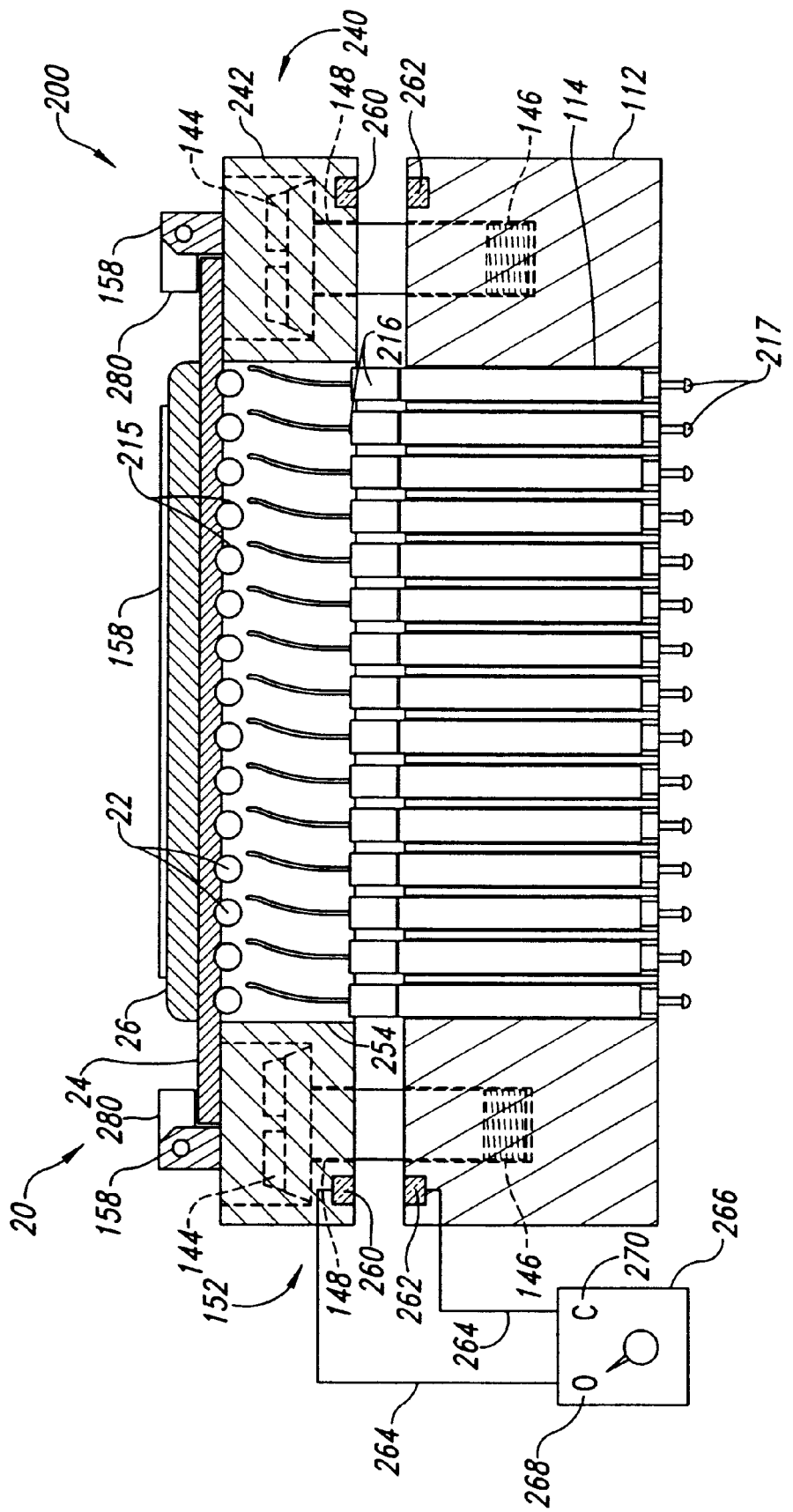
FIG. 5 is a cross-sectional view of an alternate embodiment of a conductive bump array contactor engaged with the bumped device of FIG. 2 with the ejector in a second position.

FIG. 5 is a cross-sectional view of an alternate embodiment of a conductive bump array contactor 200 engaged with the bumped device 20 of FIG. 2 with the ejector in the second position 152. In this embodiment, the conductive bump array contactor 200 has an ejector assembly 240 that includes an ejection plate 242 having a single opening 254 and a pair of hingeable retaining members 280 hingeably coupled with the alignment members 158. The base 112 includes a plurality of buckle-beam probes 216 projecting upwardly into the opening 254. Each buckle-beam probe 216 has a first end 215 that is engageable with one of the conductive bumps 22, and a second end 217 that is engageable with the test machine (not shown).

The ejector assembly 240 also includes a pair of first electro-magnets 260 disposed within the ejection plate 242, and a pair of second electro-magnets 262 disposed within the base 262 proximate to the first electro-magnets 260. The first and second electromagnets 260, 262 are electrically coupled by conductive leads 264 to a controller 266. The controller 266 is positionable between an open position 268 and a closed position 270.

In the open position 268, the controller 266 transmits electrical signals through the conductive leads 264 to the first and second electro-magnets 260, 262 to induce the same polarity in both (i.e. both north poles or both south poles), causing the first and second electromagnets 260, 262 to repel and to move the ejection plate 242 into the second position 152 (FIG. 5). In the closed position 270, the controller 266 induces opposite polarity in the first and second electromagnets 260, 262, causing the first and second electromagnets to attract and to move the ejection plate 242 into the first position 150 proximate the base 112.

One may note that the first and second magnets 260, 262 need not be electro-magnets, but rather, may simply be permanent or semi-permanent magnets. Such permanent magnets could be oriented within the ejection plate 242 and the base 112 with like poles aligned (i.e. north poles adjacent or south poles adjacent) so that the permanent magnets repel each other, thereby providing the desired biasing force to move the ejection plate 242 into the second position 152 spaced apart from the base 112. Alternately, a combination of permanent magnets and electromagnets may be used. For example. the first magnets 260 may be permanent magnets and the second magnets 262 may be electro-magnets controlled by the controller 266. The controller 266 may induce controllably reverse the polarity of the second magnets 262 (either north or south) to induce the desired repelling or attracting forces between the first and second magnets.

To begin testing using the conductive bump array contactor 200, the controller 266 may be positioned in the open position 268 to move the ejection plate 242 into the second position 152 (FIG. 5). The bumped device 20 is positioned over the ejection plate 242 with the conductive bumps 22 facing the opening 254. With the retaining members 280 hingeably moved out of way. the bumped device 20 is moved into engagement with the ejection plate 242 with the array of conductive bumps 22 being positioned within the opening 254. The alignment members 158 engage the substrate 24 of the bumped device 20 and align the conductive bumps 22 with the first ends 215 of the buckle-beam probes 216. The retaining members 280 may be hingeably actuated to engage and secure the substrate 24, securing the bumped device 20 to the ejection plate 242.

After the bumped die 20 is engaged with the ejection plate 242, the controller 266 may be moved into the closed position 270 to move the ejection plate 242 into the first position 150 proximate the base 112. Alternately, the controller 266 may be left in the open position 268 and a force may be applied to the bumped die 20 (or to the ejection plate 242) such as for example, using the handler 151 as described above, to overcome the repelling forces between the first and second electromagnets 260, 262 and to move the ejection plate 242 into the first position 150. Yet another alternative is to simply disengage the electrical signals being sent to the first and second electro-magnets 260, 262 so that no repelling (or attractive) forces exist therebetween, and the ejection plate 242 may be moved easily into the first position 150 proximate the base 112 by the handler 151 or by any other suitable means (e.g. gravity).

As the ejection plate 242 moves toward the first position 150, the first ends 215 of the buckle-beam probes 216 engage against the conductive bumps 22, providing the desired electrical contact. The second ends 217 of the buckle-beam probes 216 may then be engaged with the test machine and the testing of the bumped die 20 may be conducted in the usual manner.

After tests have been conducted, the controller 266 may be moved to the open position 270, causing the first and second electro-magnets 260, 262 to repel from each other and to move the ejection plate 242 into the second position 152 (FIG. 5). The repelling force between the first and second electro-magnets 260, 262 overcomes the sticking, bonding, or other attractive forces that may develop between the buckle-beam probes 216 and the conductive bumps 22 during the testing of the bumped device 20. The retaining members 280 may then be disengaged from the bumped device 20, and the bumped device 20 may be removed. The conductive bump array contactor 200 may then be used for testing of another bumped device 20.

It is understood that the ejection plate 242 may be divided into parts so that the ejection plate 242 does not completely surround the single opening 254. In that case, the ejection plate 242 is divided into two or more ejection members which define an opening into which the conductive bumps are engaged, each of the ejection members operating in a manner substantially similar to the ejection plate 242 to positively disengage the conductive bumps 22 from the contact elements after testing is performed.

The array contactor 200 having the ejector assembly 240 with the single opening 254 provides the advantage of positive disengagement of the conductive bumps 22 from the contact elements using a simplified, more easily fabricated ejection plate 242. Because the plurality of plate apertures 154 are eliminated, the ejector plate 242 may be less expensive to manufacture and may be easier to maintain.

Another advantage is that the ejector assembly 240 having the first and second electro-magnets 260, 262 allows the ejection plate 242 to be controllably biased into the first or second positions 150, 152 on a continuous or non-continuous basis. Because the repelling force that moves the ejection plate 242 away from the base 112 may be turned off, the force that must be applied to move the bumped device 20 into engagement with the contact elements may be reduced, thereby reducing the possibility of damaging the bumped device or the array contactor.

Furthermore, because the polarity of the electro-magnets may be reversed to induce attractive forces as well as repelling forces, the first and second electro-magnets 260, 262 perform the dual functions of positively engaging the conductive bumps with the contact elements, and positively disengaging the conductive bumps from the contact elements to overcome the sticking forces that may develop. The requirement for the handler (or other mechanism) to provide an applied force to overcome a biasing force to engage the conductive bumps with the contact elements may therefore be eliminated.

Figure 6:
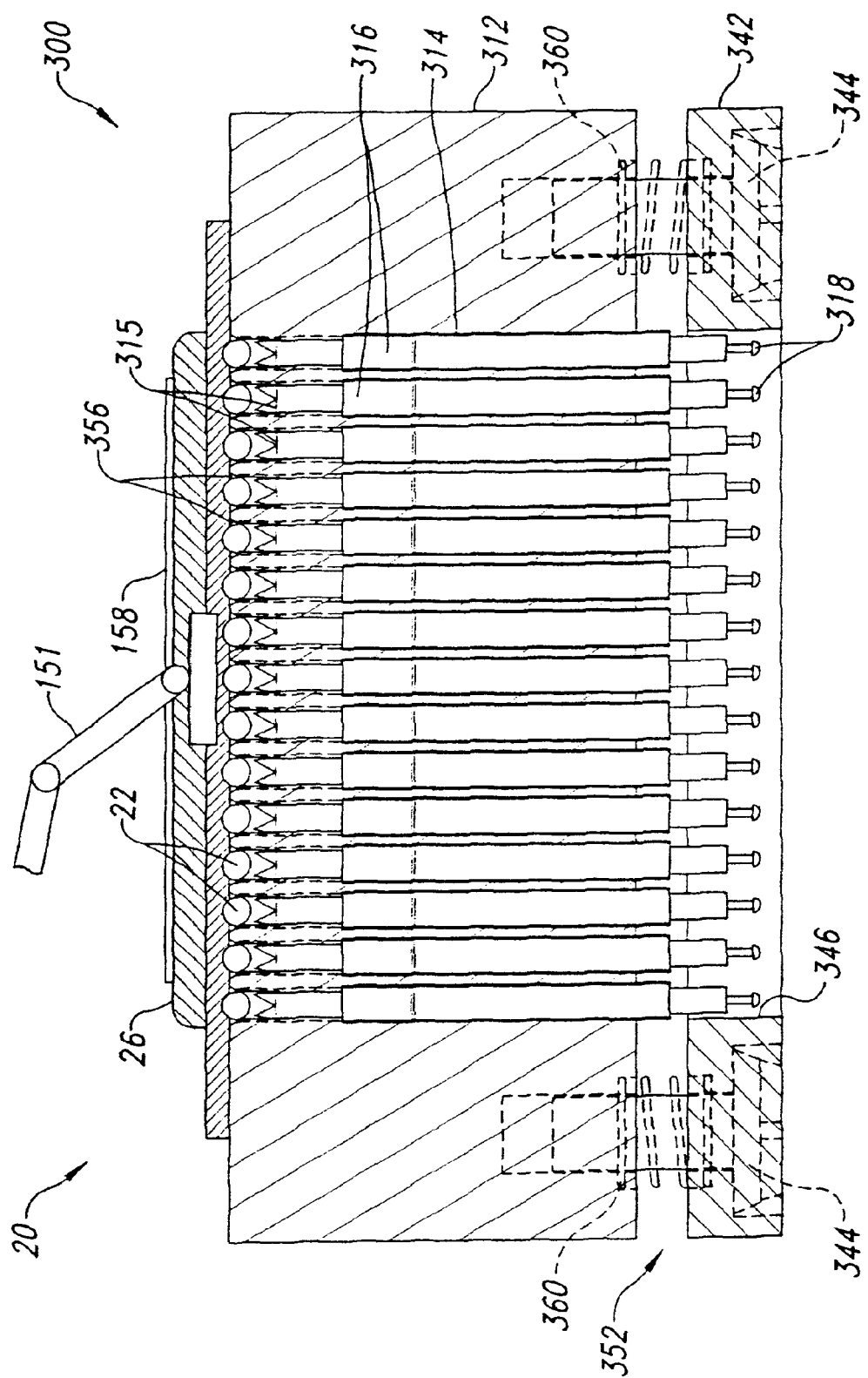
FIG. 6 is a cross-sectional view of an another embodiment of a conductive bump array contactor engaged with the bumped device of FIG. 2.

FIG. 6 is a cross-sectional view of an another embodiment of a conductive bump array contactor 300 engaged with the bumped device 20. In this embodiment, the array contactor 300 includes a first structure 312 having a plurality of apertures 314 therethrough, each aperture 314 having an enlarged end 356 for at least partially receiving a conductive bump 22. A second structure 342 is coupled to the first structure 312 by guide members 344, the second structure 342 having an opening 346.

The first structure 312 is moveable between a first position proximate the second structure 342 (not shown), and a second position 352 spaced apart from the second structure 342 (see FIG. 6). A plurality of contact elements 316 are slideably disposed within the apertures 314 of the first structure 312, each contact element 316 having a first end 315 engageable with one of the conductive bumps 22, and a second end 316 projecting into the opening 346 of the second structure 342. A coil spring 360 is disposed about each guide member 344 between the first and second structures 312, 314.

The operation of the conductive bump array contactor 300 is similar to the previously described embodiments. To test the bumped device 20, a force is applied to the first structure 312, such as by using the die handler 151, to move the first structure 312 into the first position proximate the second structure 342. In the first position, the first ends 315 of the contact elements 316 are engaged with the conductive bumps 22. The second ends 318 of the contact elements 316 project through the opening 346 of the second structure 342 and may be engaged with a test machine. After testing is complete, a disengaging force is applied to the first structure 312 by the coil springs 360 to move the first structure 312 to the second position 352. As shown in FIG. 6, in the second position 352, the first ends 315 of the contact elements 316 are disengaged from the conductive bumps 22.

The conductive bump array contactor 300 provides the above-described advantages of positive disengagement of the conductive bumps 22 from the contact elements 316, as well as improved alignment of the conductive bumps 22 with the contact elements 316, thereby improving the efficiency and reliability of the testing process.

The detailed descriptions of the above embodiments are not exhaustive descriptions of all embodiments contemplated by the inventors to be within the scope of the invention. Indeed, persons skilled in the art will recognize that certain elements of the above-described embodiments may variously be combined or eliminated to create further embodiments, and such further embodiments fall within the scope and teachings of the invention. It will also be apparent to those of ordinary skill in the art that the above-described embodiments may be combined in whole or in part with prior art apparatus and methods to create additional embodiments within the scope and teachings of the invention.

Thus, although specific embodiments of, and examples for, the invention are described herein for illustrative purposes, various equivalent modifications are possible within the scope of the invention, as those skilled in the relevant art will recognize. The teachings provided herein of the invention can be applied to other conductive bump array contactors having an ejector and methods for testing bumped devices using such apparatus, and not just to the apparatus and methods described above and shown in the figures. In general, in the following claims, the terms used should not be construed to limit the invention to the specific embodiments disclosed in the specification and the claims, but should be construed to include all conductive bump array contactors having an ejector and methods for testing bumped devices using such apparatus that operate within the broad scope of the claims. Accordingly, the invention is not limited by the foregoing disclosure, but instead its scope is to be determined by the following claims.

What is claimed is:

1. A conductive bump array contactor suitable for testing a bumped device having a plurality of conductive bumps, comprising:

a base having a plurality of buckle-beam elements projecting therefrom, the buckle-beam elements having a first end alignable with and engageable with the array of conductive bumps;

an ejector coupled to the base and moveable with respect to the base between a first position proximate the base and a second position spaced apart from the base, the ejector being positioned between the base and the bumped device and having at least one opening sized to receive the plurality of buckle-beam elements such that the buckle-beam elements project at least partially into the at least one opening and are engageable with the array of conductive bumps when the ejector is in the first position, the buckle-beam elements being disengaged from the array of conductive bumps when the ejector is in the second position; and an actuating device coupled to the base and to the ejector that asserts a force on the ejector sufficient to overcome an attractive force between the conductive bumps and the buckle-beam elements and to disengage the array of conductive bumps from the plurality of buckle-beam elements and to move the ejector into the second position.

2. The conductive bump array contactor of claim 1 wherein the ejector comprises a plate and the at least one opening comprises a plurality of apertures disposed through the plate, the plurality of apertures being alignable with the plurality of buckle-beam elements, each of the buckle-beam elements projecting at least partially into one of the apertures.

3. The conductive bump array contactor of claim 2 wherein each aperture has a receiving end sized to at least partially receive one of the conductive bumps when the bumped device is engaged with the ejector.

4. The conductive bump array contactor of claim 1 wherein the ejector comprises a plate and the at least one opening comprises a single opening disposed through the plate, the plurality of buckle-beam elements at least partially projecting into the single opening.

5. The conductive bump array contactor of claim 1 wherein the ejector includes an alignment member that projects from the ejector and is engageable with the bumped device to at least partially align the array of conductive bumps with the plurality of buckle-beam elements.

6. The conductive bump array contactor of claim 1 wherein the ejector is slideably coupled to the base by a plurality of guide posts, the actuating device including at least one coil spring disposed about one of the guide posts between the ejector and the base.

7. The conductive bump array contactor of claim 1 wherein the ejector comprises an electrically-insulative material.

8. The conductive bump array contactor of claim 1 wherein the actuating device asserts a force on the ejector sufficient to overcome a sticking force between the conductive bumps and the buckle-beam elements due to a migration of material from the conductive bumps to the buckle-beam elements.

9. The conductive bump array contactor of claim 1 wherein the actuating device comprises a coil spring that asserts a force on the ejector sufficient to overcome a sticking force between the conductive bumps and the buckle-beam elements due to a migration of material from the conductive bumps to the buckle-beam elements.

10. A conductive bump array contactor suitable for testing a bumped device having a plurality of conductive bumps, comprising:

a first structure engageable with the bumped device and having a plurality of buckle-beam elements projecting at least partially therethrough, the buckle-beam elements having a first end alignable with and engageable with the array of conductive bumps;

a second structure coupled to the first structure, the first structure being moveable with respect to the second structure between a first position proximate the second structure and a second position spaced apart from the second structure, the first structure being positioned between the second structure and the bumped device, the first structure having at least one opening therethrough and being adapted to at least partially receive the plurality of buckle beam elements therein, the buckle-beam elements being engaged with the array of conductive bumps when the first structure is in the first position, the buckle-beam elements being disengaged from the array of conductive bumps when the first structure is in the second position; and an actuating device coupled to the first structure and to the second structure that asserts a force on the first structure sufficient to overcome an attractive force between the conductive bumps and the buckle-beam elements and to move the first structure into the second position and to disengage the array of conductive bumps from the plurality of buckle-beam elements.

11. The conductive bump array contactor of claim 10 wherein the at least one opening has an enlarged receiving end sized to at least partially receive one of the conductive bumps when the bumped device is engaged with the first structure.

12. The conductive bump array contactor of claim 10 wherein the first structure is slideably coupled to the second structure by a plurality of guide posts, the actuating device including at least one coil spring disposed about one of the guide posts between the first structure and the second structure.

13. The conductive bump array contactor of claim 10 wherein the first structure includes an alignment member that projects therefrom and is adapted to be engageable with the bumped device to at least partially align the array of conductive bumps with the plurality of buckle beam probes, the alignment member including a retaining member adapted to be hingeably moveable into engagement with the bumped device to retain the bumped device into substantially fixed position with respect to the first structure.

14. The conductive bump array contactor of claim 10 wherein the first structure comprises a plate and the at least one opening comprises a plurality of apertures disposed through the plate, the plurality of apertures being alignable with the plurality of buckle beam probes, each of the buckle beam probes projecting at least partially into one of the apertures.

15. The conductive bump array contactor of claim 10 wherein the first structure comprises a plate and the at least one opening comprises a single opening disposed through the plate, the plurality of buckle beam probes at least partially projecting into the single opening.

16. The conductive bump array contactor of claim 10 wherein the second structure includes a plurality of apertures disposed therethrough, and wherein the buckle-beam probes are disposed within the apertures.

17. The conductive bump array contactor of claim 10 wherein the actuating device asserts a force on the first structure sufficient to overcome a sticking force between the conductive bumps and the buckle-beam elements due to a migration of material from the conductive bumps to the buckle-beam elements.

18. The conductive bump array contactor of claim 10 wherein the actuating device comprises a coil spring that asserts a force on the first structure sufficient to overcome a sticking force between the conductive bumps and the buckle-beam elements due to a migration of material from the conductive bumps to the buckle-beam elements.

* * * * *